(12) United States Patent
Dietz et al.

(10) Patent No.: US 6,642,717 B2
(45) Date of Patent: Nov. 4, 2003

(54) MAGNETIC RESONANCE APPARATUS HAVING A MECHANICALLY DAMPED GRADIENT COIL SYSTEM

(75) Inventors: Peter Dietz, Nuremberg (DE); Arthur Kaindl, Erlangen (DE); Lothar Schoen, Neukirchen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/898,951

(22) Filed: Jul. 3, 2001

(65) Prior Publication Data
US 2002/0008516 A1 Jan. 24, 2002

(51) Int. Cl.[7] .................................................. G01V 3/00
(52) U.S. Cl. ........................ 324/318; 324/320; 324/309
(58) Field of Search ............................... 324/318, 320, 324/319, 322, 307, 309, 30; 335/301, 300

(56) References Cited

U.S. PATENT DOCUMENTS

| 4,954,781 | A | 9/1990 | Hirata |
| 6,075,363 | A | 6/2000 | Sellers et al. |
| 6,111,412 | A | 8/2000 | Boemmel et al. |
| 6,236,207 | B1 * | 5/2001 | Arz et al. ................. 324/318 |
| 6,326,788 | B1 * | 12/2001 | Muilder et al. .......... 324/318 |

FOREIGN PATENT DOCUMENTS

| DE | OS 197 22 211 | 8/1998 |
| WO | WO 86/07459 | * 12/1986 |

* cited by examiner

*Primary Examiner*—Diego Gutierrez
*Assistant Examiner*—Brij B. Shrivastav
(74) *Attorney, Agent, or Firm*—Schiff Hardin & Waite

(57) ABSTRACT

A magnetic resonance apparatus has a gradient coil system which has at least one flexible and thermally conductive damping structure that contains a flexible matrix and thermally conductive, particulate fillers. At least parts of a cooling device of the gradient coil system are arranged within the damping structure.

11 Claims, 1 Drawing Sheet

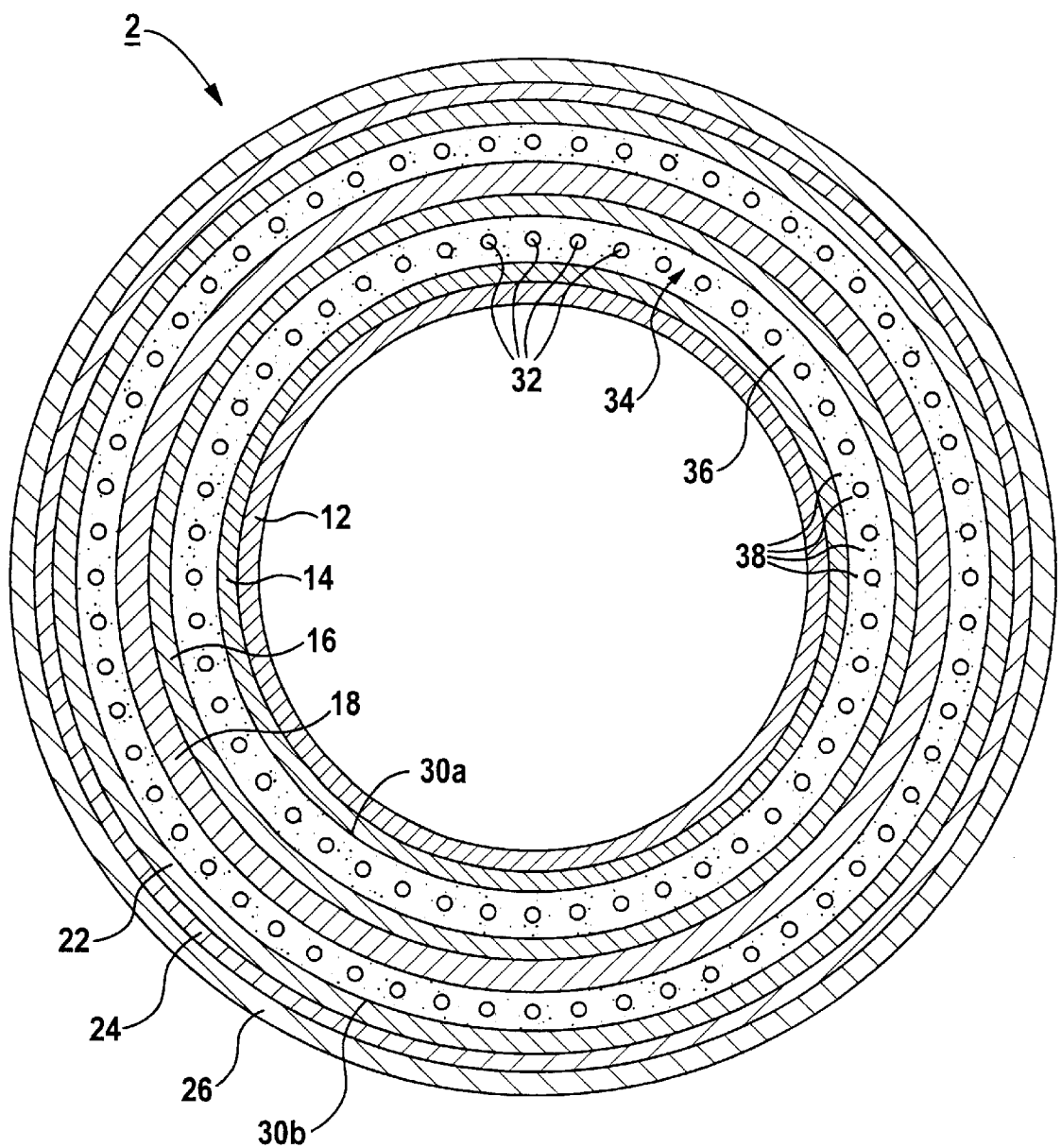

MAGNETIC RESONANCE APPARATUS HAVING A MECHANICALLY DAMPED GRADIENT COIL SYSTEM

BACKGROUND OF THE INVENTION

1. Field of the Invention

The present invention is directed to a magnetic resonance apparatus having a gradient coil system.

2. Description of the Prior Art

For generating images of the inside of the body of an examination subject, a magnetic resonance apparatus has—among other things—a basic field magnet system for generating a static basic magnetic field as well as a gradient coil system for generating rapidly switched gradient fields. Currents with amplitudes reaching several 100 A and that are subject to frequent and rapid changes in the current direction, with rise and decay rates of several 100 kA/s, flow in gradient coils of the gradient coil system. In a basic magnetic field on the order of magnitude of 1 Tesla, these currents cause mechanical oscillations of the gradient coil system due to Lorentz forces.

These oscillations are transmitted to the entire surface of the magnetic resonance apparatus via various propagation paths. Dependent on the surface velocity of the surface regions, the mechanical oscillations of the various surface regions are transformed into acoustic oscillations that ultimately cause noise that is disturbing to patients and attending personnel.

For example, German OS 197 22 211 discloses a structure of a hollow-cylindrical gradient coil system with shielding coils. From inside to outside, the gradient coil system has the following elements, which are fashioned in hollow-cylindrical regions arranged concentrically relative to one another: a first transverse gradient coil, a second transverse gradient coil, a first cooling device, a longitudinal gradient coil, a shim assembly, a second cooling device, a longitudinal shielding coil, a first transverse shielding coil and a second transverse shielding coil. These elements are cast in one work sequence to form the gradient coil system. The cooling devices as described, for example, in German OS 197 21 985, corresponding to U.S. Pat. No. 6,111,412.

Further, a number of passive and active noise-reducing measures in magnetic resonance apparatus are known. Known passive noise-reduction measures include, for example, a attachment of sound-damping foamed materials in cladding parts toward the gradient coil system and/or an arrangement of flexible layers at and/or in the gradient coil system. U.S. Pat. No. 4,954,781 discloses an example of such a measure.

German PS 197 33 742, corresponding to U.S. Pat. No. 6,075,363, further, discloses a method for noise-reduction during operation of a gradient coil of a magnetic resonance apparatus wherein the gradient coil is at least partly in contact with a reaction resin molding material, and the reaction resin molding material is kept at a temperature during operation of the gradient coil that lies in the region of the glass transition temperature of the reaction resin molding material. Maintaining this temperature is accomplished, for example, by regulation of a cooling system connected to the gradient coil, for example a water cooling system.

SUMMARY OF THE INVENTION

An object of the present invention is to provide a magnetic resonance apparatus with an improved gradient coil system that, in particular, exhibits low noise emission values.

This object is inventively achieved in a gradient coil system of a magnetic resonance apparatus having at least one flexible and thermally conductive damping structure that contains a flexible matrix and thermally conductive, particulate fillers, with at least parts of a cooling device of the gradient coil system being arranged within the damping structure. The damping structure has a hysteresis loop in the force/deformation diagram whose encompassed area is so large that the damping structure absorbs much oscillation energy of the gradient coil system. Since the damping structure is arranged in the immediate spatial proximity of the gradient coils, oscillations of the gradient coils can be damped directly at the location that causes them. As a result, the damping effect is large and a propagation of oscillations over the entire apparatus is substantially prevented. By arranging at least parts of at least one cooling device of the gradient coil system within the flexible and thermally conductive damping structure, the cooling as well as the oscillation damping of the gradient coils are accomplished by a space-efficient combined assembly. The damping structure exhibits high thermal conductivity, so that an efficient elimination of heat that arises in the gradient coils during operation thereof is assured by the cooling device across the damping structure.

DESCRIPTION OF THE DRAWING

The single FIGURE is a sectional view, taken substantially parallel to a longitudinal access of a hollow-cylindrical gradient coil system for a magnetic resonance apparatus, constructed and operating in accordance with the principals of the present invention.

DESCRIPTION OF THE PREFERRED EMBODIMENTS

As an exemplary embodiment of the invention, the FIGURE shows a crossection through a hollow-cylindrical gradient coil system 2 of a magnetic resonance apparatus. From inside to outside, the gradient coil system has comprises the following assemblies: a first transverse gradient coil 12, a second transverse gradient coil 14, a damping and cooling assembly 30a wherein cooling conduits 32 of a cooling device are embedded in a highly flexible and highly thermally conductive damping structure 34, a longitudinal gradient coil 16, a shim assembly 18, a further damping and cooling assembly 30b, a longitudinal shielding coil 22 with respect to the longitudinal gradient coil 16, a first transverse shielding coil 24 with respect to the first transverse gradient coil 12 and a second transverse shielding coil 26 with respect to the second transverse gradient coil 14. The gradient coil system 2 can be manufactured according to a method of previously cited German OS 197 22 211, whereby all of the assemblies 12 through 30b are arranged together in a casting mold and are cast together to form the gradient coil system 2.

The damping structure 34 is a flexible matrix 36 composed of a plastic into which highly thermally conductive particulate fillers 38 are embedded. The plastic matrix 36 has a usage temperature range of approximately 25 through 70° C. The damping structure 34 has a thermal conductivity from approximately 0.5 through 2 W/(m·K), preferably in the range from approximately 0.8 through 1.5 W/(m·K). Further, the plastic matrix 36 can be processed in free-flowing form as a casting resin and can be polymerized to form an elastic plastic after casting. For example, the plastic matrix 36 can be an epoxy or polyurethane based material. The flexibility of the plastic matrix 36 in the usage temperature range from approximately 25 through 70° C. is thereby set by a selection of structurally suitable reaction partners or additional flexiblizers. In particular, the flexibility of the plastic matrix 36 can be set by the flexibility of the basic structures of the casting resin, by the length of the molecules of the casting resin and/or by the number of reactive groups per molecule of the casting resin. Aliphatic basic structures and/or long molecule chains as well as molecule chains with a comparatively low number of reactive groups per molecule are especially suited.

A high thermal conductivity of the damping structure 34 is assured by embedding highly thermally conductive particulate fillers 38 into the plastic matrix 36. The particulate fillers 36 are preferably composed of materials that inherently have a thermal conductivity of greater than approximately 5 W/(m·K). For high electromagnetic compatibility for employment in a magnetic resonance apparatus, the fillers 38 are not ferromagnetic and exhibit a low electrical conductivity or a high specific volume resistance. The fillers 38 can be thereby comprise quartz, aluminum oxide, silicon carbide, aluminum nitride, boron nitride and/or zinc sulfide. If a certain degree of electrical conductivity or a low specific volume resistance of the particulate fillers 38 can be tolerated in the operation of the magnetic resonance apparatus, particulate metals such as aluminum, copper or brass can be employed. The particle size of the fillers 38 lies in the range of approximately 0.1 $\mu$m through approximately 1 mm, preferably in the range from approximately 1 through 300 $\mu$m.

A cooling device of the previously cited German OS 197 21 985 forms the basis for the damping and cooling assemblies 30a and 30b. This cooling device, in conformity with the following description, is augmented by the damping structure 34 to form the damping and cooling assembly 30a or 30b. The cooling device of German OS 197 21 985 thereby has a planar flexible carrier on which flexible cooling conduits 32 for a coolant are flexibly arranged. The cooling device is sufficiently flexible so that it can be arranged around the hollow-cylindrical, second transverse gradient coil 14. Before being attached to the gradient coil 14, the cooling device is augmented by the damping structure 34, which is introduced in a castable form. To that end, the planar flexible carrier is supplemented by lateral form walls, preferably composed of flexible webs or ridges that are glued to the flexible carrier and remain in the damping and cooling assembly 30a or 30b. During casting, the flexible carrier of the cooling device serves as lower mold part. A height of the lateral form walls is selected such that, after casting, the cooling conduits 32—dependent on the oscillation-damping effect to be achieved—are embedded partially or entirely in the damping structure 34.

For the casting, two components that form the plastic matrix 36, a resin component and a hardener component, are first separately compounded with the particulate fillers 38, and the two mixtures that are obtained are homogenized and degasified in a vacuum while being stirred, possibly at an elevated temperature. Subsequently, the two mixtures are mixed in the proper ratio to form a pourable mass, preferably in a vacuum. The mixing of the two mixtures can ensue in a continuous process via a static mixer or in a discontinuous batch mode. The cooling device provided with the mold walls is cast with the pourable mass. Dependent on the flowability of the mass, the casting temperature amounts to approximately 20 through 80° C. Dependent on a reactivity of the mass, a hardening of the mass to form the damping structure 34 ensues in a temperature range beginning at room temperature up to approximately 120° C.

Although modifications and changes may be suggested by those skilled in the at, it is the intention of the inventors to embody within the patent warranted hereon all changes and modifications as reasonably and properly come within the scope of their contribution to the art.

We claim as our invention:

1. A magnetic resonance apparatus having a gradient coil system, said gradient coil system comprising:

a gradient coil and a flexible and thermally conductive damping structure in contact with said gradient coil;

said damping structure comprising a flexible matrix with thermally conductive, particulate fillers therein; and a cooling device in thermal communication with said gradient coil, said cooling device comprising a plurality of cooling device conduits adapted to contain coolant, and at least some of said plurality of cooling device conduits being disposed within said damping structure.

2. A magnetic resonance apparatus as claimed in claim 1 wherein said fillers are embedded in said matrix.

3. A magnetic resonance apparatus as claimed in claim 1 wherein said matrix comprises a casting resin.

4. A magnetic resonance apparatus as claimed in claim 1 wherein said matrix has a base selected from the group consisting of an epoxy base and a polyurethane base.

5. A magnetic resonance apparatus as claimed in claim 1 wherein said fillers respectively have diameters in a range between approximately 0.1 $\mu$m and approximately 1 mm.

6. A magnetic resonance apparatus as claimed in claim 1 wherein said fillers have a thermal conductivity greater than approximately 5 W/(m·K).

7. A magnetic resonance apparatus as claimed in claim 1 wherein said fillers are comprised of at least one material selected from the group consisting of a quartz, aluminum oxide, silicon carbide, aluminum nitride, boron nitride and zinc sulfide.

8. A magnetic resonance apparatus as claimed in claim 1 wherein said fillers are comprised of a metal selected from the group consisting of aluminum, copper and brass.

9. A magnetic resonance apparatus as claimed in claim 1 wherein said gradient coil is a transverse gradient coil, and wherein said gradient coil system further comprises a longitudinal gradient coil, and wherein said damping structure is disposed between said transverse gradient coil and said longitudinal gradient coil.

10. A magnetic resonance apparatus as claimed in claim 1 wherein said gradient coil, said damping structure and said cooling device form a hollow-cylindrical structure.

11. A magnetic resonance apparatus as claimed in claim 1 wherein said damping structure has a thermal conductivity in a range between approximately 0.5 through 2 W/(m·K).

* * * * *